US00RE49962E

(19) United States
(12) Reissued Patent
Kuraguchi et al.

(10) Patent Number: US RE49,962 E
(45) Date of Reissued Patent: May 7, 2024

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Masahiko Kuraguchi, Yokohama (JP); Yosuke Kajiwara, Yokohama (JP); Aya Shindome, Yokohama (JP); Hiroshi Ono, Setagaya (JP); Daimotsu Kato, Kawasaki (JP); Akira Mukai, Kawasaki (JP)

(73) Assignees: Kabushiki Kaisha Toshiba, Tokyo (JP); Toshiba Electronic Devices & Storage Corporation, Tokyo (JP)

(21) Appl. No.: 17/733,818

(22) Filed: Apr. 29, 2022

Related U.S. Patent Documents

Reissue of:
(64) Patent No.: 10,714,608
Issued: Jul. 14, 2020
Appl. No.: 16/292,377
Filed: Mar. 5, 2019

(30) Foreign Application Priority Data

May 29, 2018 (JP) ..... 2018-102437

(51) Int. Cl.
*H01L 29/778* (2006.01)
*H01L 21/02* (2006.01)
(Continued)

(52) U.S. Cl.
CPC ..... *H01L 29/7787* (2013.01); *H01L 29/2003* (2013.01); *H01L 29/205* (2013.01);
(Continued)

(58) Field of Classification Search
CPC ..... H01L 21/28114; H01L 21/324; H01L 21/76897; H01L 29/66446; H01L 23/535;
(Continued)

(56) References Cited

U.S. PATENT DOCUMENTS 6,639,275 B2 10/2003 Ninomiya
6,781,197 B2 8/2004 Fujishima et al.
(Continued)

FOREIGN PATENT DOCUMENTS

JP 2002-280549 9/2002
JP 2003-249650 9/2003
(Continued)

*Primary Examiner* — Minh Nguyen
(74) *Attorney, Agent, or Firm* — Oblon, McClelland, Maier & Neustadt, L.L.P.

(57) ABSTRACT

According to one embodiment, a semiconductor device includes first and second regions, a first insulating portion, and first, second, and third electrodes. The first region includes first and second partial regions, and a third partial region between the first and second partial regions. The second region includes fourth and fifth partial regions. The fourth partial region overlaps the first partial region. The fifth partial region overlaps the second partial region. The first insulating portion includes first, second, and third insulating regions. The first insulating region is provided between the second insulating region and the third partial region and between the third insulating region and the third partial region. The first electrode is electrically connected to the fourth partial region. The second electrode is away from the first electrode and is electrically connected to the fifth partial region. The third electrode is provided between the first and second electrodes.

26 Claims, 5 Drawing Sheets

(51) Int. Cl.

| | |
|---|---|
| ***H01L 29/20*** | (2006.01) |
| ***H01L 29/205*** | (2006.01) |
| ***H01L 29/40*** | (2006.01) |
| ***H01L 29/417*** | (2006.01) |
| ***H01L 29/423*** | (2006.01) |
| ***H01L 29/45*** | (2006.01) |
| ***H01L 29/49*** | (2006.01) |
| ***H01L 29/66*** | (2006.01) |

(52) U.S. Cl.
CPC ..... *H01L 29/402* (2013.01); *H01L 29/41725* (2013.01); *H01L 29/4236* (2013.01); *H01L 29/42364* (2013.01); *H01L 29/42376* (2013.01); *H01L 29/452* (2013.01); *H01L 29/4966* (2013.01); *H01L 29/66462* (2013.01); *H01L 29/7786* (2013.01); *H01L 21/02164* (2013.01); *H01L 21/0217* (2013.01); *H01L 21/0254* (2013.01); *H01L 29/401* (2013.01)

(58) Field of Classification Search
CPC ..... H01L 29/66462; H01L 29/78; H01L 21/3245; H01L 29/4238; H01L 29/7786; H01L 21/3006; H01L 29/201; H01L 21/30604; H01L 29/402; H01L 29/2003; H01L 29/41758; H01L 29/4236
See application file for complete search history.

(56) References Cited

U.S. PATENT DOCUMENTS

| | | | | |
|---|---|---|---|---|
| 7,012,301 | B2 | 3/2006 | Tabuchi et al. | |
| 10,256,100 | B2 * | 4/2019 | Hirai | H01L 21/28114 |
| 2007/0045670 | A1 | 3/2007 | Kuraguchi | |
| 2012/0146097 | A1 | 6/2012 | Endo et al. | |
| 2013/0001696 | A1 | 1/2013 | Akiyama et al. | |
| 2016/0079066 | A1 | 3/2016 | Takada et al. | |
| 2016/0172474 | A1 * | 6/2016 | Miyake | H01L 29/7783 257/76 |
| 2016/0260615 | A1 * | 9/2016 | Hirai | H01L 29/4238 |
| 2018/0261681 | A1 * | 9/2018 | Yonehara | H01L 29/205 |
| 2019/0288021 | A1 | 9/2019 | Shindome | |
| 2019/0288081 | A1 * | 9/2019 | Shindome | H01L 29/4236 |

FOREIGN PATENT DOCUMENTS

| | | |
|---|---|---|
| JP | 2007-067240 | 3/2007 |
| JP | 4608133 | 1/2011 |
| JP | 2012-124440 | 6/2012 |
| JP | 2013-012692 A | 1/2013 |
| JP | 2016-062976 A | 4/2016 |

* cited by examiner

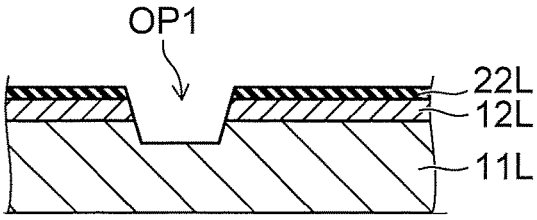
FIG. 2A
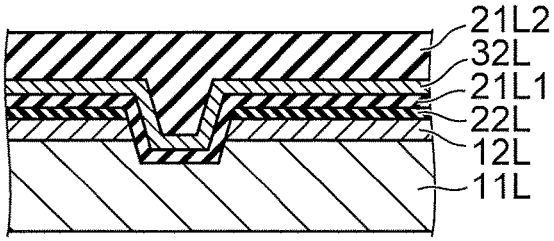
FIG. 2B
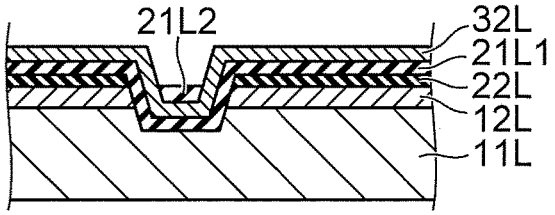
FIG. 2C
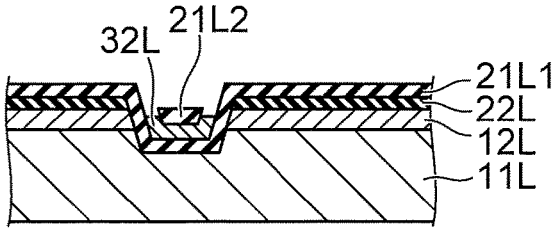
FIG. 2D
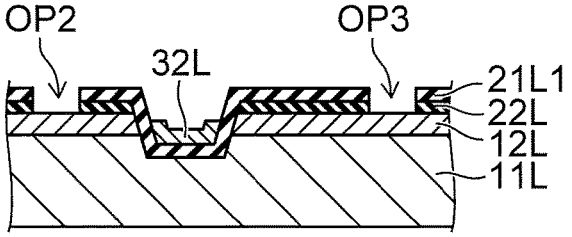
FIG. 2E
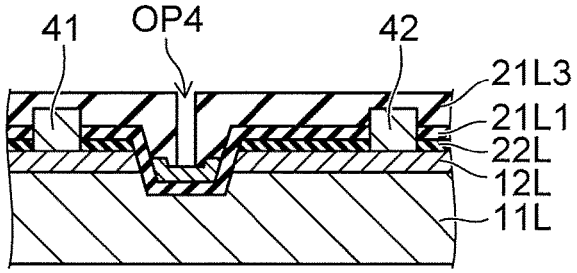
FIG. 2F
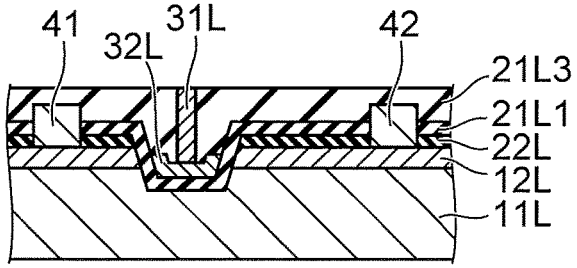
FIG. 2G
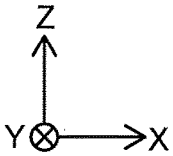

SEMICONDUCTOR DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application *is a reissue application of U.S. Pat. No. 10,714,608, issued Jul. 14, 2020* (*U.S. application Ser. No. 16,292,377, filed Mar. 5, 2019*), *which* is based upon and claims the benefit of priority from Japanese Patent Application No. 2018-102437, filed on May 29, 2018; the entire contents *of each* of which are incorporated herein by reference.

FIELD

Embodiments described herein relate generally to a semiconductor device.

BACKGROUND is a semiconductor device including gallium and nitrogen. The semiconductor device is requested to improve in characteristics.

BRIEF DESCRIPTION OF THE DRAWINGS

FIG. 2A to FIG. 2G are cross-sectional views schematically illustrating a method for manufacturing the semiconductor device according to the embodiment;

DETAILED DESCRIPTION

Figure 1:
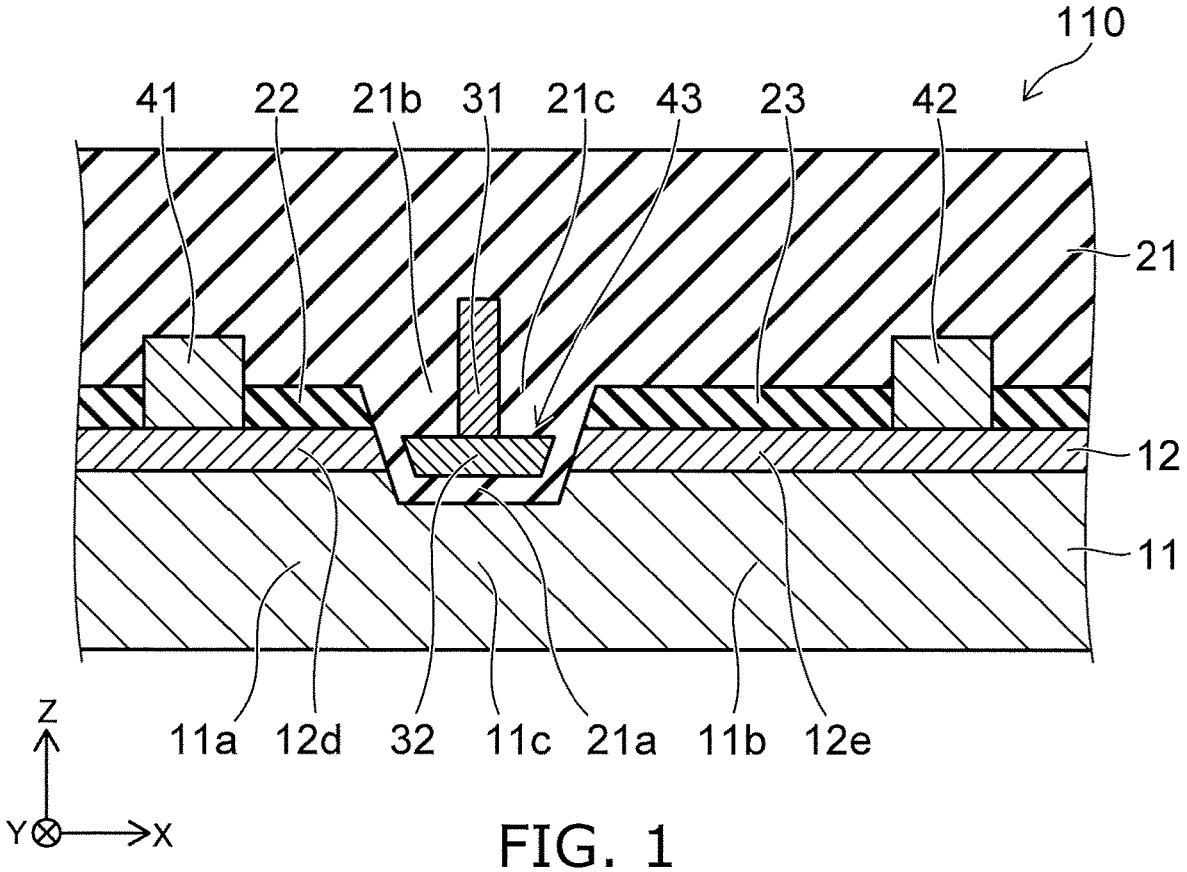
FIG. 1 is a cross-sectional view schematically illustrating a semiconductor device according to an embodiment.

According to one embodiment, a semiconductor device includes a first region, a second region, a first insulating portion, a first electrode, a second electrode, and a third electrode. The first region includes $Al_{x1}Ga_{1-x1}N$ ($0 \leq x1 < 1$). The first region includes a first partial region, a second partial region, and a third partial region between the first partial region and the second partial region. The second region includes $A_{x2}Ga_{1-x2}N$ ($0 < x2 < 1$, $x1 < x2$). The second region includes a fourth partial region and a fifth partial region. The fourth partial region overlaps the first partial region in a first direction crossing a second direction from the first partial region to the second partial region. The fifth partial region overlaps the second partial region in the first direction. The first insulating portion includes a first insulating region, a second insulating region, and a third insulating region. The first insulating region overlaps the third partial region in the first direction. The second insulating region is away from a part of the first insulating region in the first direction. The third insulating region is away from another part of the first insulating region in the first direction and away from the second insulating region in the second direction. The first insulating region is provided between the second insulating region and the third partial region and between the third insulating region and the third partial region. The first electrode is electrically connected to the fourth partial region. The second electrode is away from the first electrode in the second direction. The second electrode is electrically connected to the fifth partial region. The third electrode is provided between the first electrode and the second electrode. The third electrode includes a first conductive portion and a second conductive portion. The first conductive portion is provided between the second insulating region and the third insulating region. The second conductive portion is provided between the first insulating region and the second insulating region, between the first insulating region and the third insulating region, and between the first insulating region and the first conductive portion.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

FIG. 1 is a cross-sectional view schematically illustrating a semiconductor device according to an embodiment.

As shown in FIG. 1, the semiconductor device 110 includes a first region 11, a second region 12, a first insulating portion 21, a first electrode 41, a second electrode 42, and a third electrode 43.

The first region 11 includes a first partial region 11a, a second partial region 11b, and a third partial region 11c. The third partial region 11c is positioned between the first partial region 11a and the second partial region 11b.

The direction from the first partial region 11a toward the second partial region 11b is defined as a second direction. The second direction is along, for example, the X-axis direction shown in FIG. 1. One direction perpendicular to the X-axis direction is defined as the Y-axis direction. The direction perpendicular to the X-axis direction and the Y-axis direction is defined as the Z-axis direction. The direction crossing the second direction is defined as a first direction. The first direction is along, for example, the Z-axis direction. The direction crossing the first direction and the second direction is defined as a third direction. The third direction is along, for example, the Y-axis direction.

Hereinafter, the case where the first direction, the second direction, and the third direction are respectively along the Z-axis direction, the X-axis direction, and the Y-axis direction will be described.

The second region 12 includes a fourth partial region 12d and a fifth partial region 12e. The fourth partial region 12d overlaps the first partial region 11a in the Z-axis direction. The fifth partial region 12e overlaps the second partial region 11b in the Z-axis direction. The fifth partial region 12e is away from the fourth partial region 12d in the X-axis direction.

The second region 12 is provided between the first region 11 and the first insulating portion 21 in the Z-axis direction. The first insulating portion 21 includes a first insulating region 21a, a second insulating region 21b, and a third insulating region 21c. The first insulating region 21a overlaps the third partial region 11c in the Z-axis direction. The second insulating region 21b is away from a part of the first insulating region 21a in the Z-axis direction. The third insulating region 21c is away from another part of the first insulating region 21a in the Z-axis direction. The third insulating region 21c is away from the second insulating region 21b in the X-axis direction. The first insulating region 21a is provided between the third partial region 11c and the second insulating region 21b and between the third partial region 11c and the third insulating region 21c.

The first electrode 41 is electrically connected to the fourth partial region 12d. A part of the fourth partial region 12d is positioned between a part of the first partial region 11a and the first electrode 41 in the Z-axis direction.

The second electrode 42 is electrically connected to the fifth partial region 12e. A part of the fifth partial region 12e is positioned between a part of the second partial region 11b and the second electrode 42 in the Z-axis direction.

The third electrode 43 is provided between the first electrode 41 and the second electrode 42. The third electrode 43 includes a first conductive portion 31 and a second conductive portion 32.

The first conductive portion 31 is provided between the second insulating region 21b and the third insulating region 21c in the X-axis direction.

In the Z-axis direction, the second conductive portion 32 is provided between the first insulating region 21a and the second insulating region 21b, between the first insulating region 21a and the third insulating region 21c, and between the first insulating region 21a and the first conductive portion 31. The second conductive portion 32 is connected to the first conductive portion 31.

In the example shown in FIG. 1, the semiconductor device 110 further includes a second insulating portion 22 and a third insulating portion 23.

The second insulating portion 22 overlaps the fourth partial region 12d in the Z-axis direction. The fourth partial region 12d is positioned between the first partial region 11a and the second insulating portion 22. The second insulating portion 22 is provided around the first electrode 41 along the plane including the X-axis direction and the Y-axis direction.

The third insulating portion 23 overlaps the fifth partial region 12e in the Z-axis direction. The fifth partial region 12e is positioned between the second partial region 11b and the third insulating portion 23. The third insulating portion 23 is provided around the second electrode 42 along the plane including the X-axis direction and the Y-axis direction.

The second insulating region 21b, the third insulating region 21c, and the first conductive portion 31 are provided, for example, between the first electrode 41 and the second electrode 42 in the X-axis direction. For example, the distance in the X-axis direction between the first electrode 41 and the third electrode 43 is shorter than the distance in the X-axis direction between the second electrode 42 and the third electrode 43. The first region 11 includes $Al_{x1}Ga_{1-x1}N$ ($0 \leq x1 < 1$). The first region 11 includes, for example, GaN. The second region 12 includes $Al_{x2}Ga_{1-x2}N$ ($0 < x2 < 1$, $x1 < x2$). The second region 12 includes, for example, AlGaN.

The first insulating portion 21 includes, for example, at least one selected from the group consisting of oxygen and nitrogen, and silicon. For example, the first insulating portion 21 is formed of a silicon nitride film, a silicon oxide film, or a silicon oxynitride film. The second insulating portion 22 and the third insulating portion 23 include, for example, silicon and nitrogen. The second insulating portion 22 and the third insulating portion 23 are formed of, for example, a silicon nitride film.

The first conductive portion 31 includes, for example, at least one selected from the group consisting of titanium, gold, and aluminum. The second conductive portion 32 includes, for example, at least one selected from the group consisting of titanium and molybdenum, and nitrogen. The first electrode 41 and the second electrode 42 include, for example, at least one selected from the group consisting of titanium and aluminum.

The first electrode 41 functions as a source electrode, for example. The second electrode 42 functions as a drain electrode, for example. The first insulating region 21a functions as a gate insulating layer. The second conductive portion 32 in contact with the first insulating region 21a functions as a gate electrode.

Two-dimensional electron gas is generated near the interface between the first region 11 and the second region 12. The potential of the second conductive portion 32 is set to be not less than the threshold value in a state where the potential of the second electrode 42 is set to a value larger than the potential of the first electrode 41. Thus, a channel is formed near the interface between the third partial region 11c and the first insulating region 21a. Electrons flow through the channel from the first electrode 41 toward the second electrode 42, and the semiconductor device 110 is brought into an ON state.

According to the semiconductor device 110 according to the embodiment, the characteristics can be improved.

For example, in the semiconductor device according to a reference example, the first insulating portion 21 does not include the second insulating region 21b and the third insulating region 21c. The length of the first conductive portion 31 in the X-axis direction is longer than the length of the second conductive portion 32 in the X-axis direction. The first conductive portion 31 overlaps the end portion of the second insulating portion 22 and the end portion of the third insulating portion 23 in the Z-axis direction.

Two semiconductor devices (first semiconductor device and second semiconductor device) according to the reference example were prepared. The first semiconductor device and the second semiconductor device are different in the compositions of the second insulating portion 22 and the third insulating portion 23. In the first semiconductor device and the second semiconductor device, the second insulating portion 22 and the third insulating portion 23 are formed of a silicon nitride film. The first semiconductor device and the second semiconductor device are different in the composition ratios between silicon and nitrogen, of the second insulating portion 22 and the third insulating portion 23. On these two semiconductor devices, the first characteristics and second characteristics were examined.

The first characteristics are shift amounts of the threshold voltage when a positive potential is continuously applied to the third electrode 43 for a predetermined time. The first characteristics relate to the electric charge being trapped in the third insulating portion 23.

The second characteristics are shift amounts of the threshold voltage when a negative potential is continuously applied to the third electrode 43 for a predetermined time.

The second characteristics relate to the electric charge being trapped inside the first region 11 or in the interface between the second region 12 and the third insulating portion 23.

As a result of the experiment, regarding the first semiconductor device, the value of the first characteristics was large and the value of the second characteristics was small. That is, regarding the first semiconductor device, the second characteristics were good and the first characteristics were not good. Regarding the second semiconductor device, the first characteristics were good and the second characteristics were not good. In the semiconductor device according to the reference example, improvement in both the first characteristics and the second characteristics is not easy.

The inventors found that the first characteristics and the second characteristics can be improved by providing the second insulating region 21b and the third insulating region 21c in the first insulating portion 21. According to the semiconductor device 110, the first characteristics and the second characteristics can be improved.

When a positive potential is applied to the third electrode 43, providing the second insulating region 21b and the third insulating region 21c allows the electric field applied to the third insulating portion 23 to be weakened. Therefore, it is considered that the electric charge trapped in the third insulating portion 23 can be reduced and the first characteristics can be improved. In addition, when a negative potential is applied to the third electrode 43, providing the second insulating region 21b and the third insulating region 21c allows the electric field applied to the interior of the first region 11 or the interface between the second region 12 and the third insulating portion 23 to be weakened. Therefore, it is considered that the electric charge trapped inside the first region 11 or in the interface between the second region 12 and the third insulating portion 23 is reduced, and the second characteristics can be improved.

FIG. 2A to FIG. 2G are cross-sectional views schematically illustrating a method for manufacturing the semiconductor device according to the embodiment.

A first layer 11L including $Al_{x1}Ga_{1-x1}N$ ($0 \leq x1 < 1$) is formed. A second layer 12L including $Al_{x2}Ga_{1-x2}N$ ($0 < x2 < 1$, $x1 < x2$) is formed on the first layer 11L. An insulating layer 22L including silicon and nitrogen is formed on the second layer 12L. A part of the insulating layer 22L, a part of the second layer 12L, and a part of the first layer 11L are removed. Thus, as shown in FIG. 2A, a first opening OP1 is formed.

An insulating layer 21L1 is formed along the inner wall of the first opening OP1 and the upper surface of the insulating layer 22L. A conductive layer 32L is formed along the upper surface of the insulating layer 21L1. As shown in FIG. 2B, an insulating layer 21L2 is formed on the conductive layer 32L. The insulating layers 21L1 and 21L2 include, for example, silicon and oxygen. The conductive layer 32L includes, for example, titanium and nitrogen.

As shown in FIG. 2C, a part of the insulating layer 21L2 is removed. As shown in FIG. 2D, a part of the conductive layer 32L is removed. The insulating layer 21L2 is removed. As shown in FIG. 2E, removing a part of the insulating layer 21L1 and a part of the insulating layer 22L forms the second opening OP2 and the third opening OP3. A first electrode 41 and a second electrode 42 are respectively formed in the second opening OP2 and the third opening OP3.

An insulating layer 21L3 is formed on the conductive layer 32L, the first electrode 41, and the second electrode 42. As shown in FIG. 2F, a part of the insulating layer 21L3 is removed, and a fourth opening OP4 is formed. As shown in FIG. 2G, a conductive layer 31L is formed in the fourth opening OP4. An insulating layer is formed on the insulating layer 21L3 and the conductive layer 31L. Thus, the semiconductor device 110 according to the embodiment is manufactured.

Figure 3A:
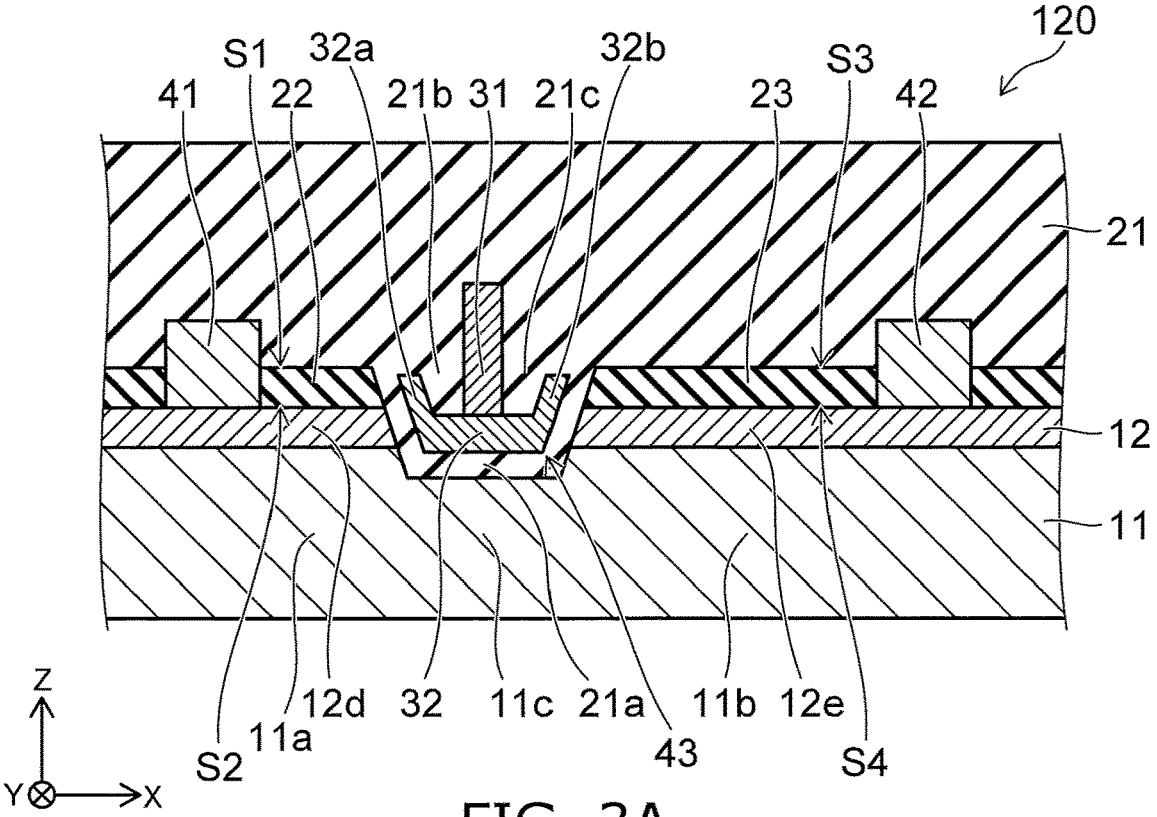
FIG. 3A and FIG. 3B are cross-sectional views schematically illustrating other semiconductor devices according to the embodiment.
Figure 3B:
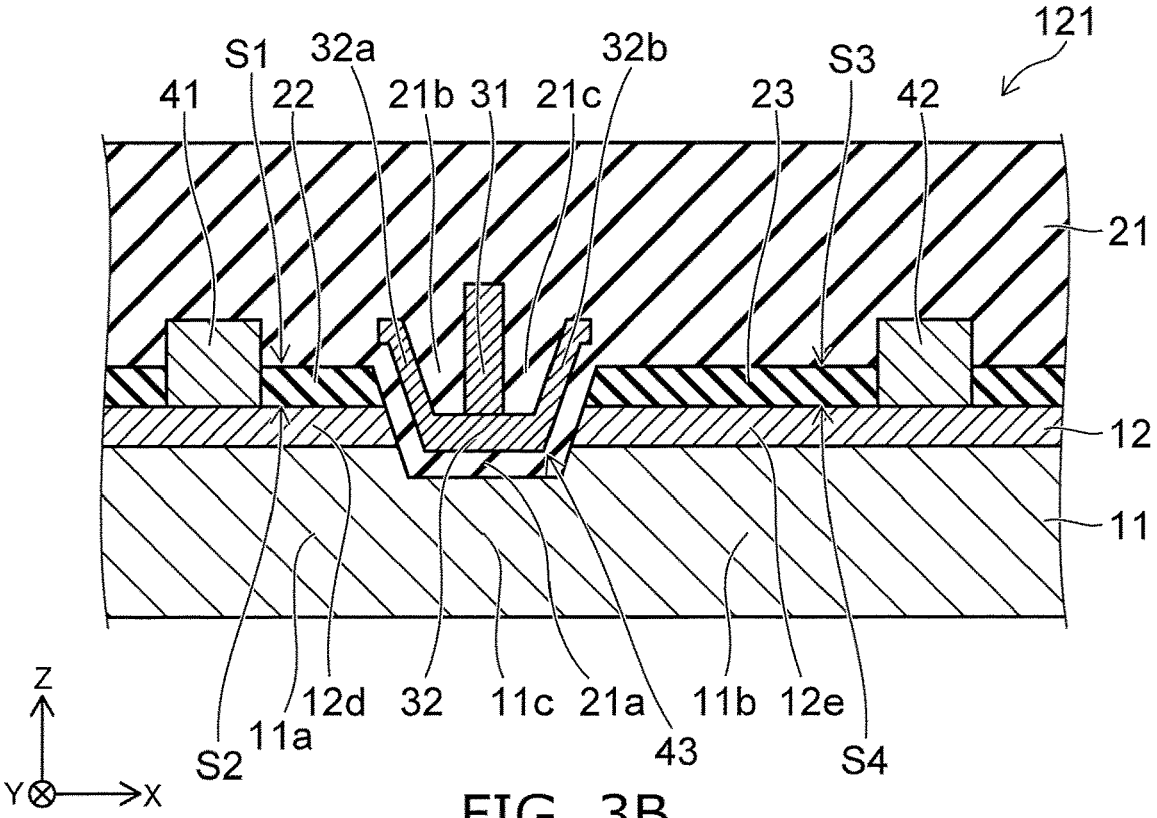

FIG. 3A and FIG. 3B are cross-sectional views schematically illustrating other semiconductor devices according to the embodiment.

In the semiconductor device 120 shown in FIG. 3A, the second conductive portion 32 includes a first conductive region 32a and a second conductive region 32b.

The first conductive region 32a is positioned between the second insulating portion 22 and the second insulating region 21b in the X-axis direction. The second conductive region 32b is positioned between the third insulating portion 23 and the third insulating region 21c in the X-axis direction.

The second insulating portion 22 has a first surface S1 and a second surface S2. The first surface S1 and the second surface S2 cross the Z-axis direction, and are along a plane including the X-axis direction and the Y-axis direction. The second surface S2 is positioned between the first surface S1 and the fourth partial region 12d in the Z-axis direction. The direction from the first surface S1 to the first conductive portion 31 is along the X-axis direction.

The third insulating portion 23 has a third surface S3 and a fourth surface S4. The third surface S3 and the fourth surface S4 cross the Z-axis direction and are along a plane including the X-axis direction and the Y-axis direction. The fourth surface S4 is positioned between the third surface S3 and the fifth partial region 12e in the Z-axis direction. The direction from the third surface S3 to the first conductive portion 31 is along the X-axis direction.

The position in the Z-axis direction of the first conductive region 32a is, for example, between the position in the Z-axis direction of the first surface S1 and the position in the Z-axis direction of the first region 11. The position in the Z-axis direction of the second conductive region 32b is, for example, between the position in the Z-axis direction of the third surface S3 and the position in the Z-axis direction of the first region 11.

As in the semiconductor device 121 shown in FIG. 3B, the direction from the first surface S1 to a part of the first conductive region 32a may be along the X-axis direction. The first conductive region 32a does not overlap the first surface S1 in the Z-axis direction. The direction from the third surface S3 to a part of the second conductive region 32b may be along the X-axis direction. The second conductive region 32b does not overlap the third surface S3 in the Z-axis direction.

In the semiconductor device, the second conductive portion 32 desirably overlaps the third partial region 11c in the Z-axis direction. The second conductive portion 32 desirably overlaps the interface between the first region 11 and the second region 12 in the X-axis direction. Thus, the on-resistance of the semiconductor device can be reduced.

According to the semiconductor device 120 or 121, the area of the portion where the second region 12 and the second conductive portion 32 overlap each other in the X-axis direction increases as compared with that in the semiconductor device 110. When the semiconductor device is manufactured, even if variation of the shape of the second conductive portion 32 arises, the second conductive portion 32 tends to overlap the interface between the first region 11 and the second region 12 in the X-axis direction. According to the semiconductor device 120 or 121, as compared with the semiconductor device 110, the manufacture is facilitated. For example, the yield can be improved.

Figure 4A:
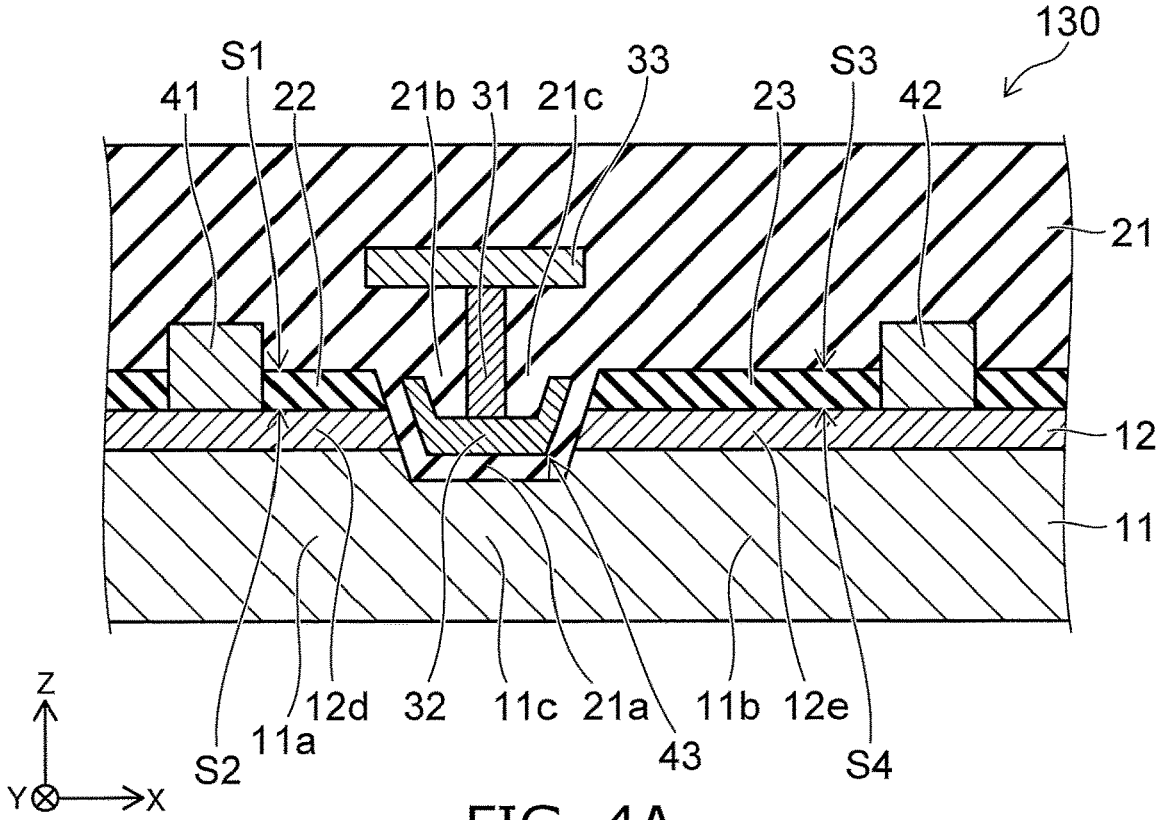
FIG. 4A and FIG. 4B are cross-sectional views schematically illustrating other semiconductor devices according to the embodiment.
Figure 4B:
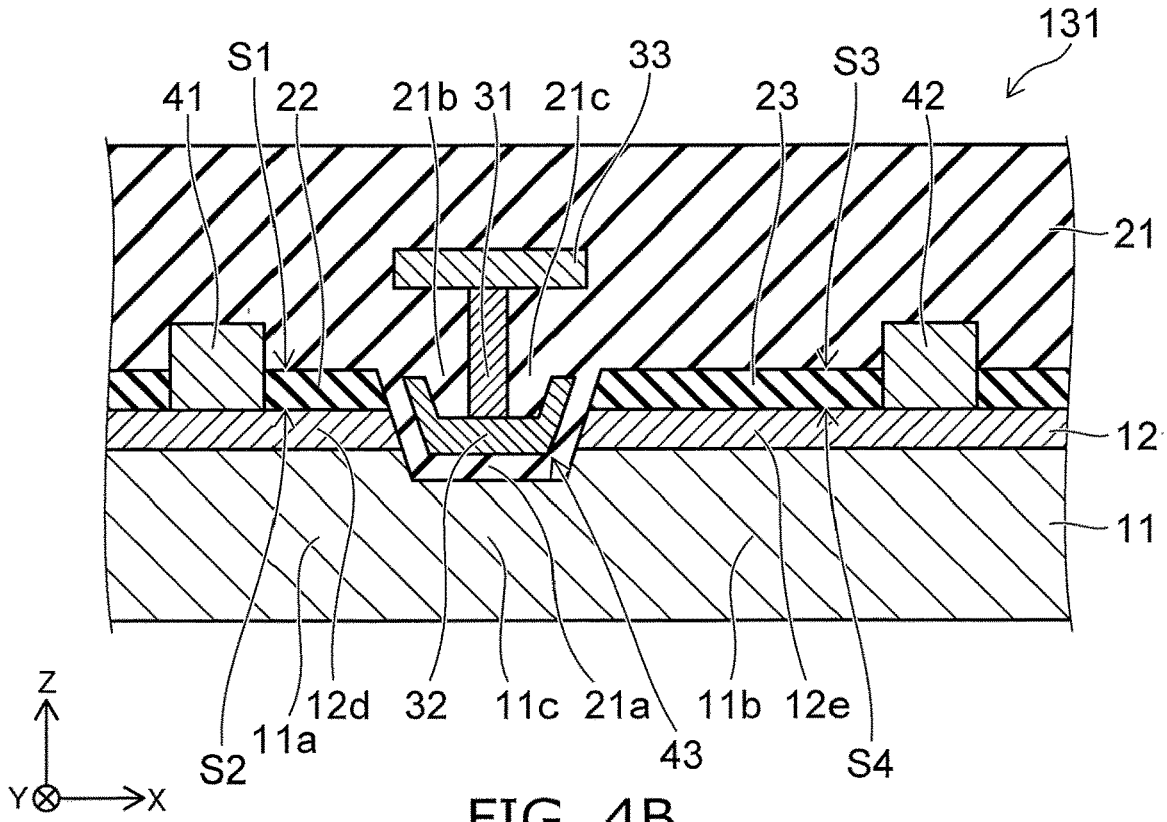

FIG. 4A and FIG. 4B are cross-sectional views schematically illustrating other semiconductor devices according to the embodiment.

In the semiconductor device 130 shown in FIG. 4A, the third electrode 43 further includes a third conductive portion 33. The second insulating region 21b, the third insulating region 21c, and the first conductive portion 31 are provided between the second conductive portion 32 and the third conductive portion 33 in the Z-axis direction.

The third conductive portion 33 does not overlap the third surface S3 in the Z-axis direction. For example, the third conductive portion 33 overlaps the first surface S1 in the Z-axis direction. Providing the third conductive portion 33 allows the electrical resistance of the third electrode 43 (for example, gate resistance) to be reduced. In addition, when the third conductive portion 33 overlaps the first surface S1, the manufacture of the semiconductor device 130 is facilitated. Thus, for example, the yield can be improved.

As in the semiconductor device 131 shown in FIG. 4B, the third conductive portion 33 does not have to overlap the first surface S1 and the third surface S3 in the Z-axis direction.

The third conductive portion 33 includes, for example, at least one selected from the group consisting of titanium, gold, and aluminum.

According to the semiconductor device 130 or 131, as compared with the semiconductor device HO, electric field concentration near the second conductive portion 32 can be mitigated. Thus, for example, the breakdown voltage can be improved.

Figure 5:
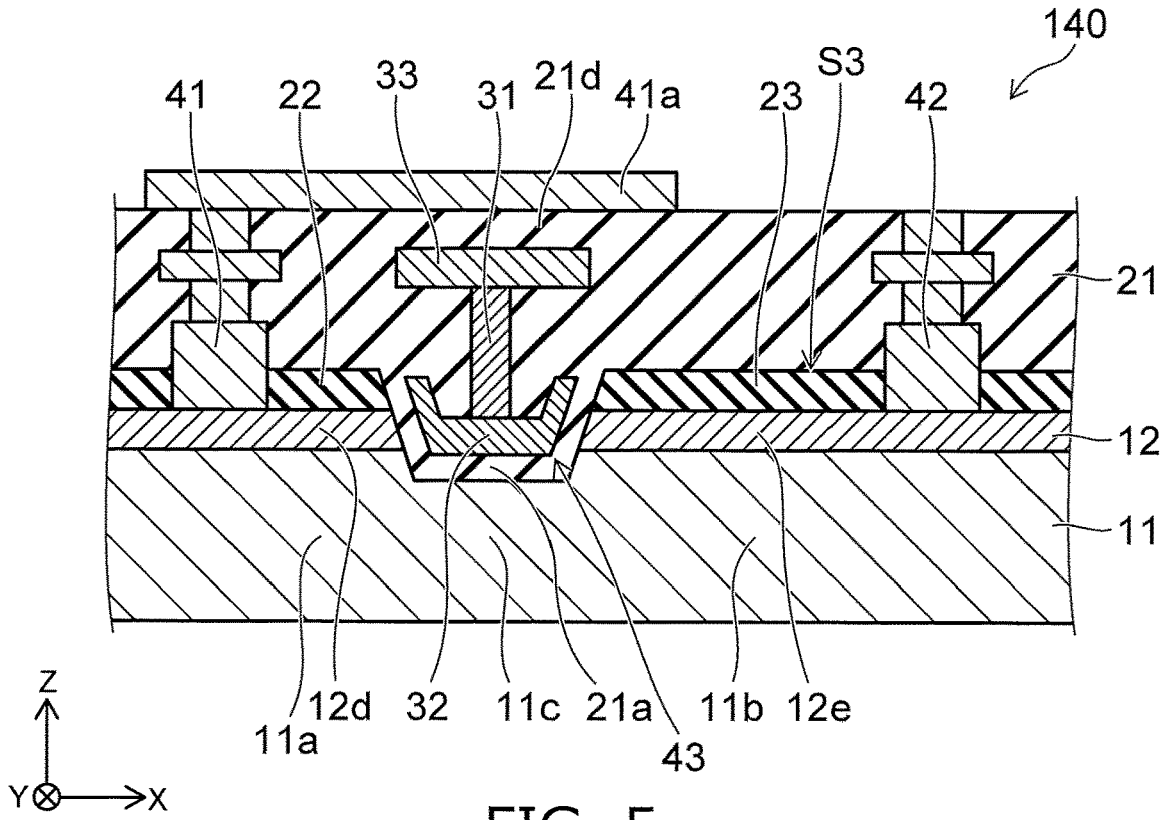
FIG. 5 is a cross-sectional view schematically illustrating another semiconductor device according to the embodiment.

FIG. 5 is a cross-sectional view schematically illustrating another semiconductor device according to the embodiment.

In the semiconductor device 140 shown in FIG. 5, the first electrode 41 includes a first electrode portion 41a. The first insulating portion 21 includes a fourth insulating region 21d.

The first electrode portion 41a is away from the third electrode 43 in the Z-axis direction. The fourth insulating region 21d and the third conductive portion 33 are provided between the first conductive portion 31 and the first electrode portion 41a in the Z-axis direction.

The first electrode portion 41a overlaps the third electrode 43 and the third surface S3 in the Z-axis direction. The first electrode portion 41a does not overlap the second electrode 42 in the Z-axis direction. The distance in the X-axis direction between the first electrode portion 41a and the second electrode 42 is shorter than the distance in the X-axis direction between the third electrode 43 and the second electrode 42.

According to the semiconductor device 140, as compared with the semiconductor device 130, electric field concentration near the second conductive portion 32 can be mitigated. Thus, for example, the breakdown voltage can be improved.

Figure 6:
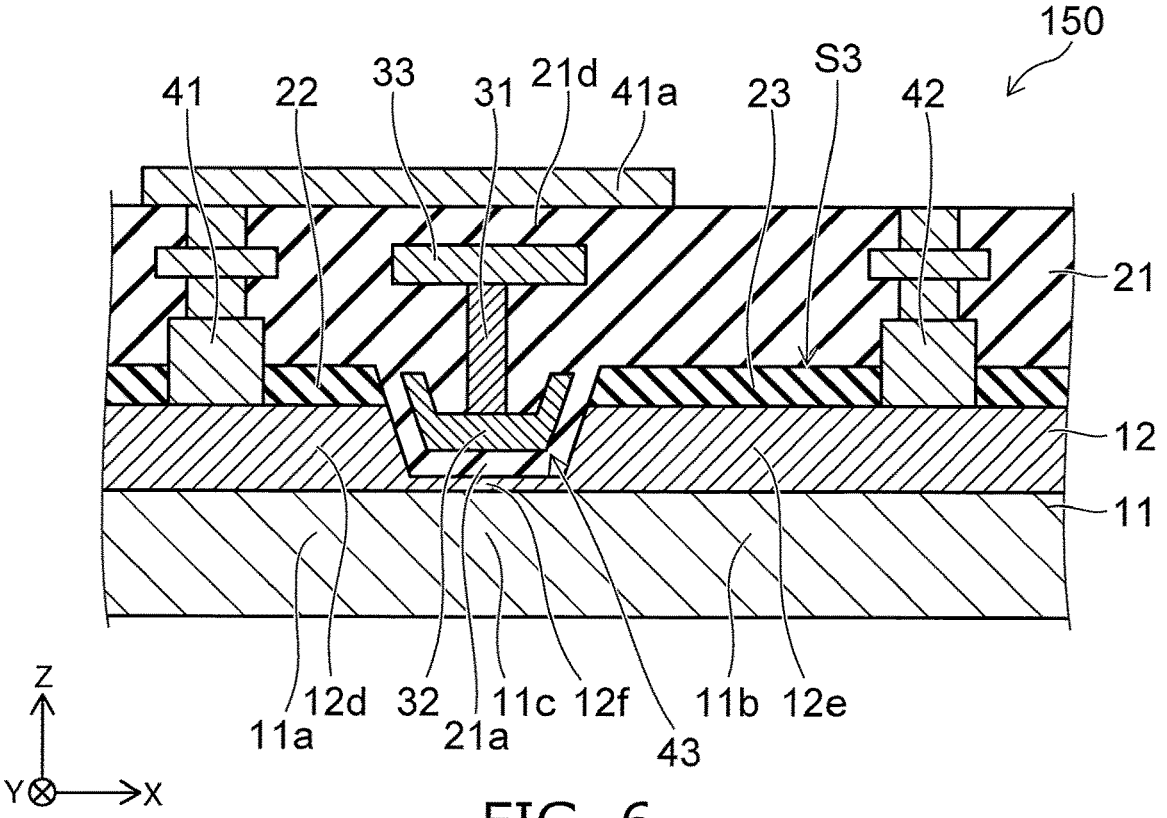
FIG. 6 is a cross-sectional view schematically illustrating another semiconductor device according to the embodiment.

FIG. 6 is a cross-sectional view schematically illustrating another semiconductor device according to the embodiment.

In the semiconductor device 150 shown in FIG. 6, the second region 12 further includes a sixth partial region 12f.

The sixth partial region 12f is positioned between the fourth partial region 12d and the fifth partial region 12e in the X-axis direction. The sixth partial region 12f is positioned between the third partial region 11c and the first insulating region 21a in the Z-axis direction. In the semiconductor device 150, when the potential of the second conductive portion 32 is set to be not less than a threshold value, a channel is formed near the interface between the sixth partial region 12f and the first insulating region 21a. Providing the sixth partial region 12f allows the channel resistance to be reduced. As a result, the on-resistance of the semiconductor device 150 can be reduced. The length in the Z-axis direction of the sixth partial region 12f is shorter than the length in the Z-axis direction of the fourth partial region 12d and shorter than the length in the Z-axis direction of the fifth partial region 12e.

In the semiconductor device 110, 120, 121, 130, or 131, as in the semiconductor device 150, the second region 12 may include the sixth partial region 12f.

According to each of the above-described embodiments, a semiconductor device capable of improving characteristics can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as first regions, second regions, insulating portions, conductive portions, electrodes, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:

a first region including $A_{x1}Ga_{1-x1}N$ ($0 \leq x1 < 1$), the first region including a first partial region, a second partial region, and a third partial region between the first partial region and the second partial region;

a second region including $A_{x2}Ga_{1-x2}N$ ($0 < x2 < 1$, $x1 < x2$), the second region including a fourth partial region overlapping the first partial region in a first direction crossing a second direction from the first partial region to the second partial region, and a fifth partial region overlapping the second partial region in the first direction;

a first insulating portion including a first insulating region overlapping the third partial region in the first direction, a second insulating region away from a part of the first insulating region in the first direction, and a third insulating region away from another part of the first insulating region in the first direction and away from the second insulating region in the second direction, the first insulating region being provided between the second insulating region and the third partial region and between the third insulating region and the third partial region;

a first electrode electrically connected to the fourth partial region;

a second electrode away from the first electrode in the second direction, the second electrode [electrically] being *electrically* connected to the fifth partial region; and a third electrode provided between the first electrode and the second electrode, the third electrode including a first conductive portion provided between the second insulating region and the third insulating region, and a second conductive portion provided *between the fourth partial region and the fifth partial region in the second direction, the second conductive portion being longer in the second direction than the first conductive portion, a part of the second conductive portion being provided* between the first insulating region and the second insulating region, *another part of the second conductive portion being provided* between the first insulating region and the third insulating region, and *another part of the second conductive portion being provided* between the first insulating region and the first conductive portion.

2. The device according to claim 1, further comprising:

a second insulating portion; and a third insulating portion, the [fifth] *fourth* partial region being provided between the first partial region and the second insulating portion in the first direction, the fifth partial region being provided between the second partial region and the third insulating portion in the first direction, and the second conductive portion including a first conductive region provided between the second insulating portion and the second insulating region in the second direction.

3. The device according to claim 2, wherein the second insulating portion has a first surface and a second surface, the first surface and the second surface cross the first direction, and are along the second direction, the second surface is provided between the first surface and the fourth partial region, and a direction from the first surface to the first conductive portion is along the second direction.

4. The device according to claim 3, wherein the first conductive region does not overlap the first surface in the first direction.

5. The device according to claim 3, wherein a position in the first direction of the first conductive region is between a position in the first direction of the first surface and a position in the first direction of the first region.

6. The device according to claim 3, wherein the second conductive portion further includes a second conductive region, the second conductive region is provided between the third insulating portion and the third insulating region in the second direction, the third insulating portion has a third surface and a fourth surface, the third surface and the fourth surface cross the first direction, and are along the second direction, the fourth surface is provided between the third surface and the fifth partial region, and a direction from the third surface to the first conductive portion is along the second direction.

7. The device according to claim 6, wherein the second conductive region does not overlap the third surface in the first direction.

8. The device according to claim 6, wherein a position in the first direction of the second conductive region is between a position in the first direction of the third surface and a position in the first direction of the first region.

9. The device according to claim 6, further comprising:

a third conductive portion connected to the first conductive portion, the first conductive portion, the second insulating region, and the third insulating region are provided between the second conductive portion and the third conductive portion, and the third conductive portion not overlapping the third surface in the first direction.

10. The device according to claim 3, further comprising:

a third conductive portion connected to the first conductive portion, the first conductive portion, the second insulating region, and the third insulating region being provided between the second conductive portion and the third conductive portion, and the third conductive portion not overlapping the first surface in the first direction.

11. The device according to claim 3, wherein the first insulating portion includes silicon and oxygen, and the second insulating portion and the third insulating portion include silicon and nitrogen.

12. The device according to claim 1, wherein the first conductive portion, the second insulating region, and the third insulating region are provided between the first electrode and the second electrode in the second direction.

13. The device according to claim 1, wherein the first conductive portion includes at least one selected from the group consisting of titanium, gold, and aluminum, and nitrogen, and the second conductive portion includes at least one selected from the group consisting of titanium and molybdenum.

*14. A semiconductor device comprising:*

*a first region including* $Al_{x1}Ga_{1-x1}N$ $(0 \leq x1 < 1)$, *the first region including*

*a first partial region,*

*a second partial region, and*

*a third partial region between the first partial region and the second partial region;*

*a second region including* $Al_{x2}Ga_{1-x2}N$ $(0 < x2 < 1,\ x1 < x2)$, *the second region including*

*a fourth partial region overlapping the first partial region in a first direction crossing a second direction from the first partial region to the second partial region, and*

*a fifth partial region overlapping the second partial region in the first direction;*

*a first insulating portion including*

*a first insulating region,*

*a second insulating region, and*

*a third insulating region,*

*the first insulating region being provided between the second insulating region and the third partial region and between the third insulating region and the third partial region;*

*a first electrode electrically connected to the fourth partial region;*

*a second electrode away from the first electrode in the second direction, the second electrode being electrically connected to the fifth partial region; and*

*a third electrode provided between the first electrode and the second electrode, the third electrode including*

*a first conductive portion provided between the second insulating region and the third insulating region in the second direction, and*

*a second conductive portion provided between the fourth partial region and the fifth partial region in the second direction, the second conductive portion being longer in the second direction than the first conductive portion, the second conductive portion including a first part, a second part, and a third part, the first part being provided between the first insulating region and the second insulating region, the second part being provided between the first insulating region and the third insulating region, the first insulating region being provided between the third partial region and the first conductive portion in the first direction, the third part being provided between the first insulating region and the first conductive portion, a part of the first insulating portion being provided between the fourth partial region and the second conductive portion in the second direction, and another part of the first insulating portion being provided between the fifth partial region and the second conductive portion in the second direction.*

*15. The device according to claim 14, further comprising:*

*a second insulating portion; and*

*a third insulating portion,*

*the fourth partial region being provided between the first partial region and the second insulating portion in the first direction,*

*the fifth partial region being provided between the second partial region and the third insulating portion in the first direction, and*

*the second conductive portion including a first conductive region provided between the second insulating portion and the second insulating region in the second direction.*

*16. The device according to claim 15,*

*wherein the second insulating portion has a first surface and a second surface,*

*the first surface and the second surface cross the first direction, and are along the second direction,*

*the second surface is provided between the first surface and the fourth partial region, and*

*a direction from the first surface to the first conductive portion is along the second direction.*

*17. The device according to claim 16,*

*wherein the first conductive region does not overlap the first surface in the first direction.*

*18. The device according to claim 16,*

*wherein a position in the first direction of the first conductive region is between a position in the first direction of the first surface and a position in the first direction of the first region.*

*19. The device according to claim 16,*

*wherein the second conductive portion further includes a second conductive region,*

*the second conductive region is provided between the third insulating portion and the third insulating region in the second direction,*

*the third insulating portion has a third surface and a fourth surface,*

*the third surface and the fourth surface cross the first direction, and are along the second direction,*

*the fourth surface is provided between the third surface and the fifth partial region, and*

*a direction from the third surface to the first conductive portion is along the second direction.*

*20. The device according to claim 19,*

*wherein the second conductive region does not overlap the third surface in the first direction.*

*21. The device according to claim 19,*

*wherein a position in the first direction of the second conductive region is between a position in the first direction of the third surface and a position in the first direction of the first region.*

*22. The device according to claim 19, further comprising:*

*a third conductive portion connected to the first conductive portion,*

*the first conductive portion, the second insulating region, and the third insulating region being provided between the second conductive portion and the third conductive portion, and*

*the third conductive portion not overlapping the first surface in the first direction.*

*23. The device according to claim 19, further comprising:*

*a third conductive portion connected to the first conductive portion,*

*the first conductive portion, the second insulating region, and the third insulating region are provided between the second conductive portion and the third conductive portion, and*

*the third conductive portion not overlapping the third surface in the first direction.*

*24. The device according to claim 19,*

*wherein the first insulating portion includes silicon and oxygen, and*

*the second insulating portion and the third insulating portion include silicon and nitrogen.*

*25. The device according to claim 14,*

*wherein the first conductive portion, the second insulating region, and the third insulating region are provided between the first electrode and the second electrode in the second direction.*

*26. The device according to claim 14,*

*wherein the first conductive portion includes at least one selected from the group consisting of titanium, gold, and aluminum, and nitrogen, and*

*the second conductive portion includes at least one selected from the group consisting of titanium and molybdenum.*

* * * * *